(12) United States Patent
Schulz

(10) Patent No.: US 12,440,355 B2
(45) Date of Patent: Oct. 14, 2025

(54) EMG-AMPLIFIER UNIT

(71) Applicant: Stefan Schulz, Karlsruhe (DE)

(72) Inventor: Stefan Schulz, Karlsruhe (DE)

( * ) Notice: Subject to any disclaimer, the term of this patent is extended or adjusted under 35 U.S.C. 154(b) by 948 days.

(21) Appl. No.: 17/382,592

(22) Filed: Jul. 22, 2021

(65) Prior Publication Data
US 2022/0031478 A1 Feb. 3, 2022

(30) Foreign Application Priority Data

Jul. 22, 2020 (DE) ...................... 10 2020 119 343.2

(51) Int. Cl.
| | | |
|---|---|---|
| *A61F 2/72* | (2006.01) | |
| *G16H 40/63* | (2018.01) | |
| *H03F 3/04* | (2006.01) | |
| *A61B 5/313* | (2021.01) | |

(52) U.S. Cl.
CPC ............... *A61F 2/72* (2013.01); *G16H 40/63* (2018.01); *H03F 3/04* (2013.01); *A61B 5/313* (2021.01)

(58) Field of Classification Search
CPC .. A61F 2/72; G16H 40/63; H03F 3/04; A61B 5/313
See application file for complete search history.

(56) References Cited

U.S. PATENT DOCUMENTS

| | | | | |
|---|---|---|---|---|
| 4,623,454 A | * | 11/1986 | Tauscher | ................ B01J 19/32 210/150 |
| 11,883,175 B2 | * | 1/2024 | Ramos Murguialday | .................. A61B 5/389 |
| 2016/0317058 A1 | * | 11/2016 | Kaminski | ................ A61B 5/30 |
| 2023/0398004 A1 | * | 12/2023 | Messner | .............. A61B 5/6811 |

OTHER PUBLICATIONS

Ottobock Myo Plus, Apr. 1, 2019, 212 pages (Year: 2019).*

* cited by examiner

*Primary Examiner* — Bruce E Snow
(74) *Attorney, Agent, or Firm* — Finch & Maloney PLLC

(57) ABSTRACT

An EMG amplifier unit for placement at or in a prosthesis stem, whereby the EMG amplifier unit comprises a first input signal contact group for connection of the EMG amplifier unit with a first EMG electrode, a second input signal contact group for the connection of the EMG amplifier unit with a second EMG electrode and an output signal contact group for direct and/or indirect connection of the EMG amplifier unit with a prosthesis control.

3 Claims, 21 Drawing Sheets

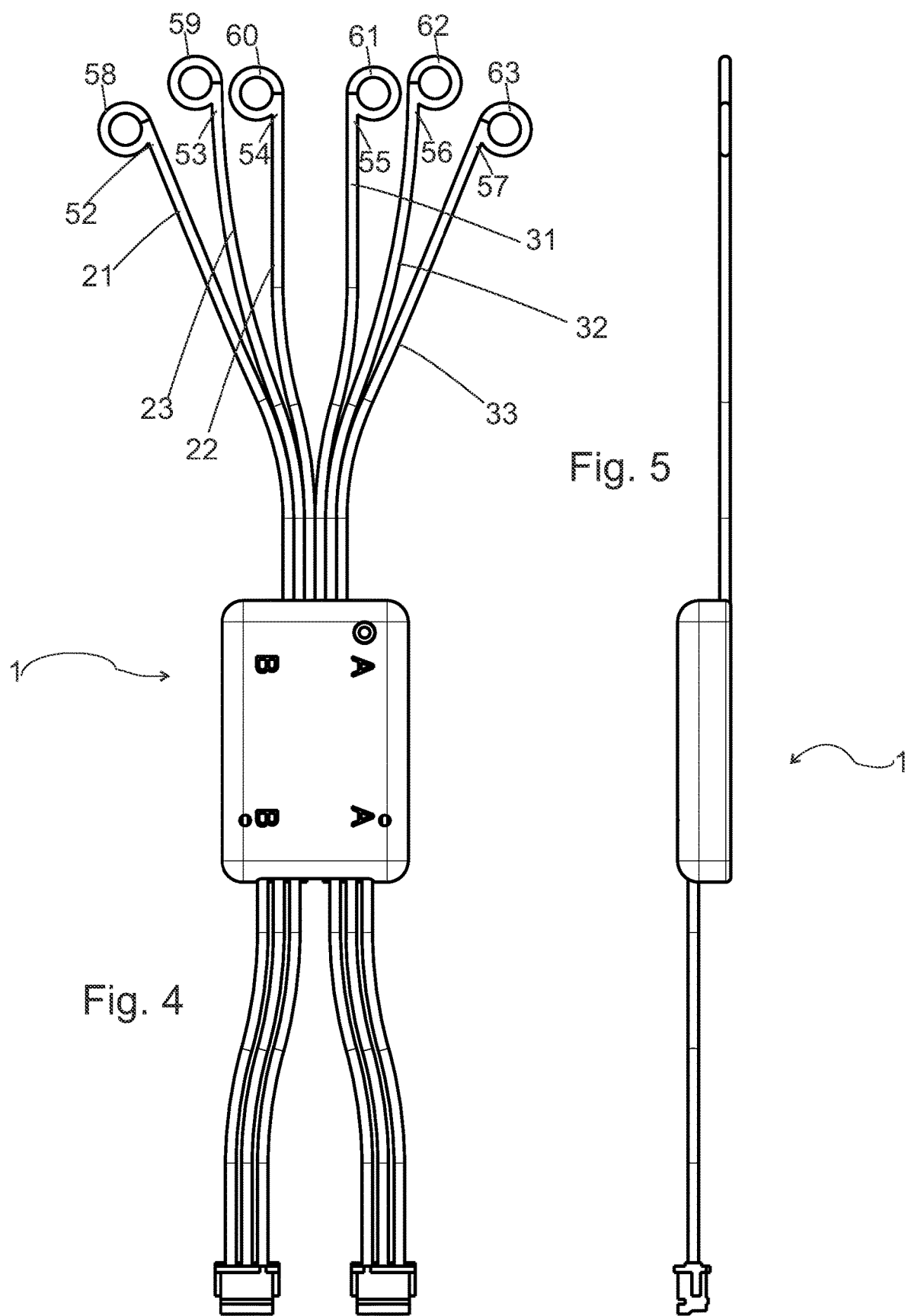

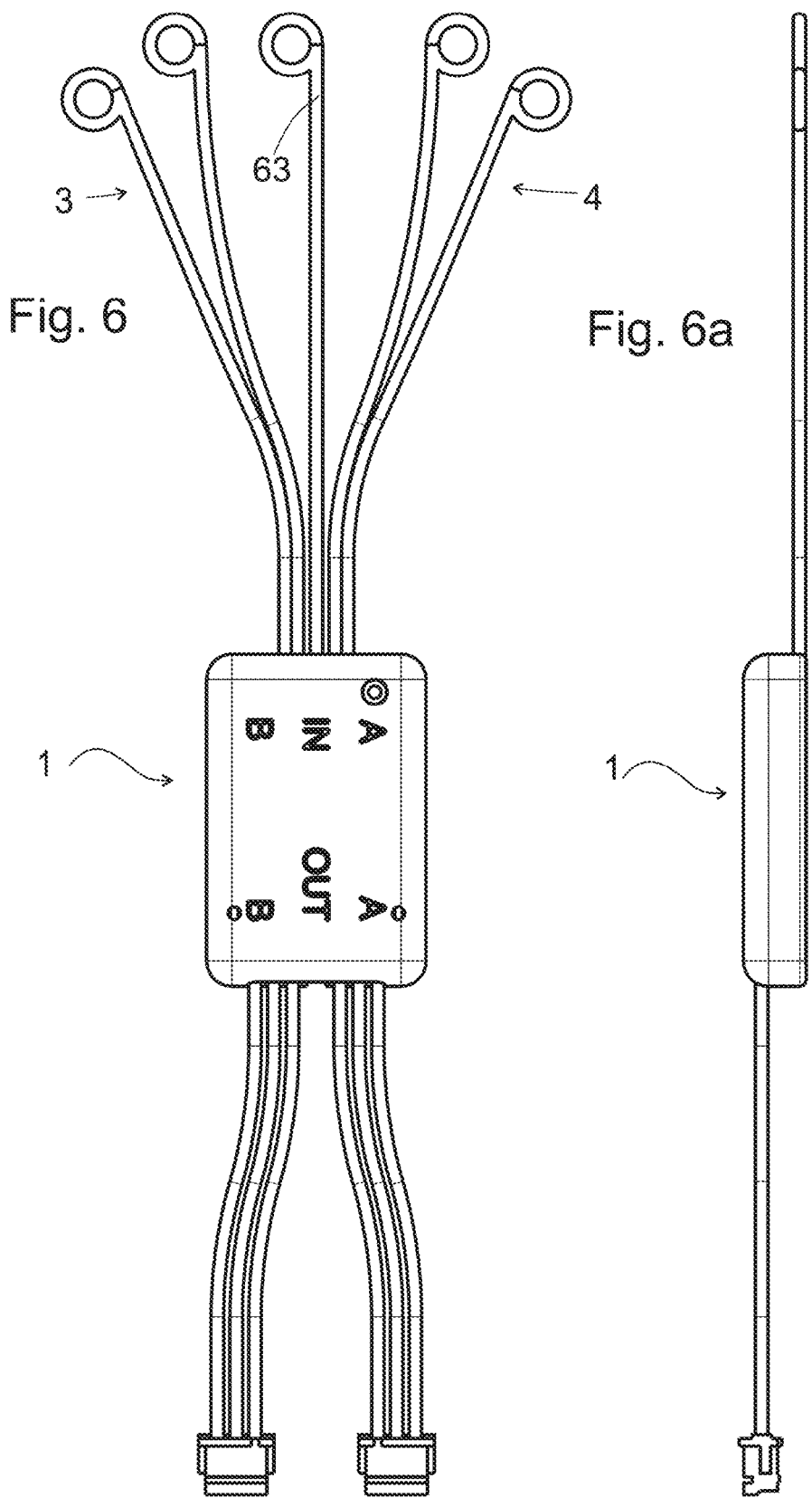

Fig. 9a
Fig. 9b
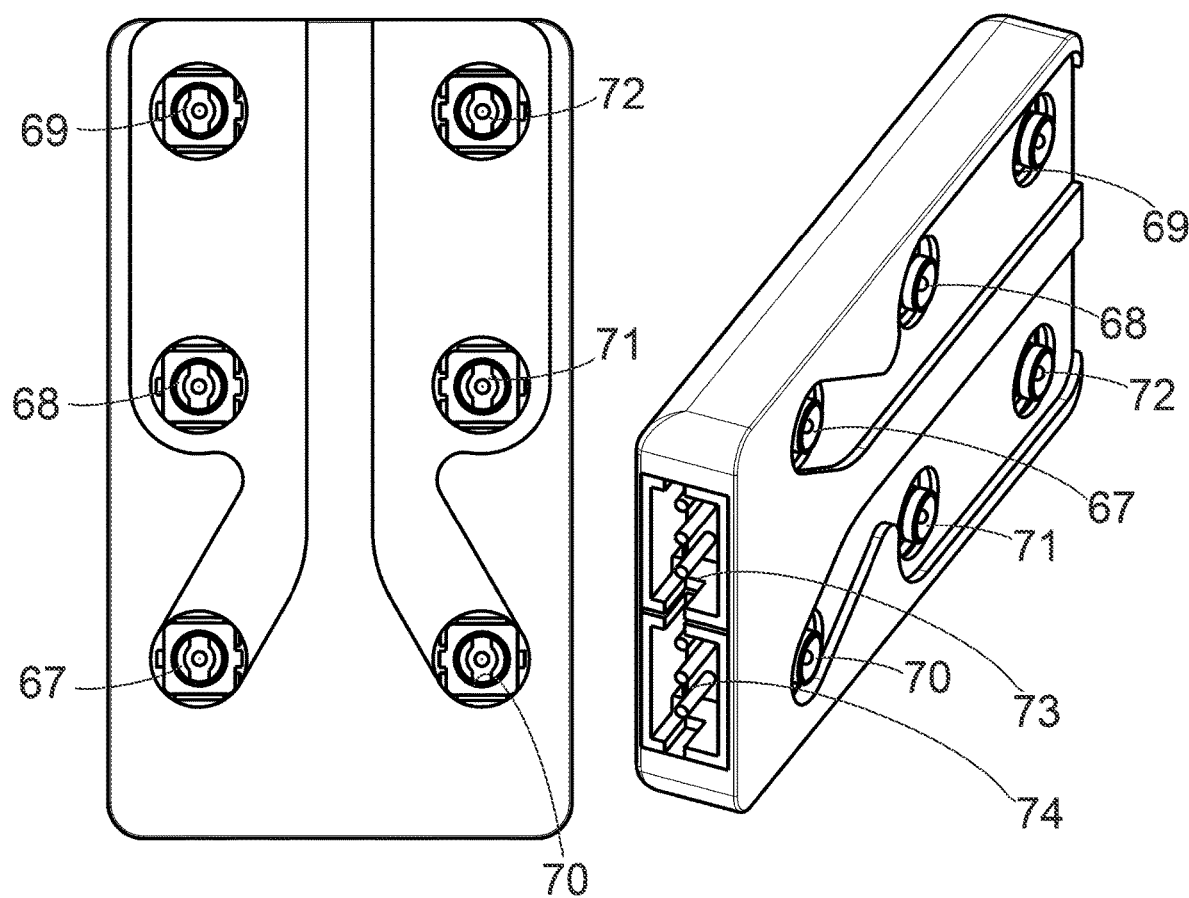

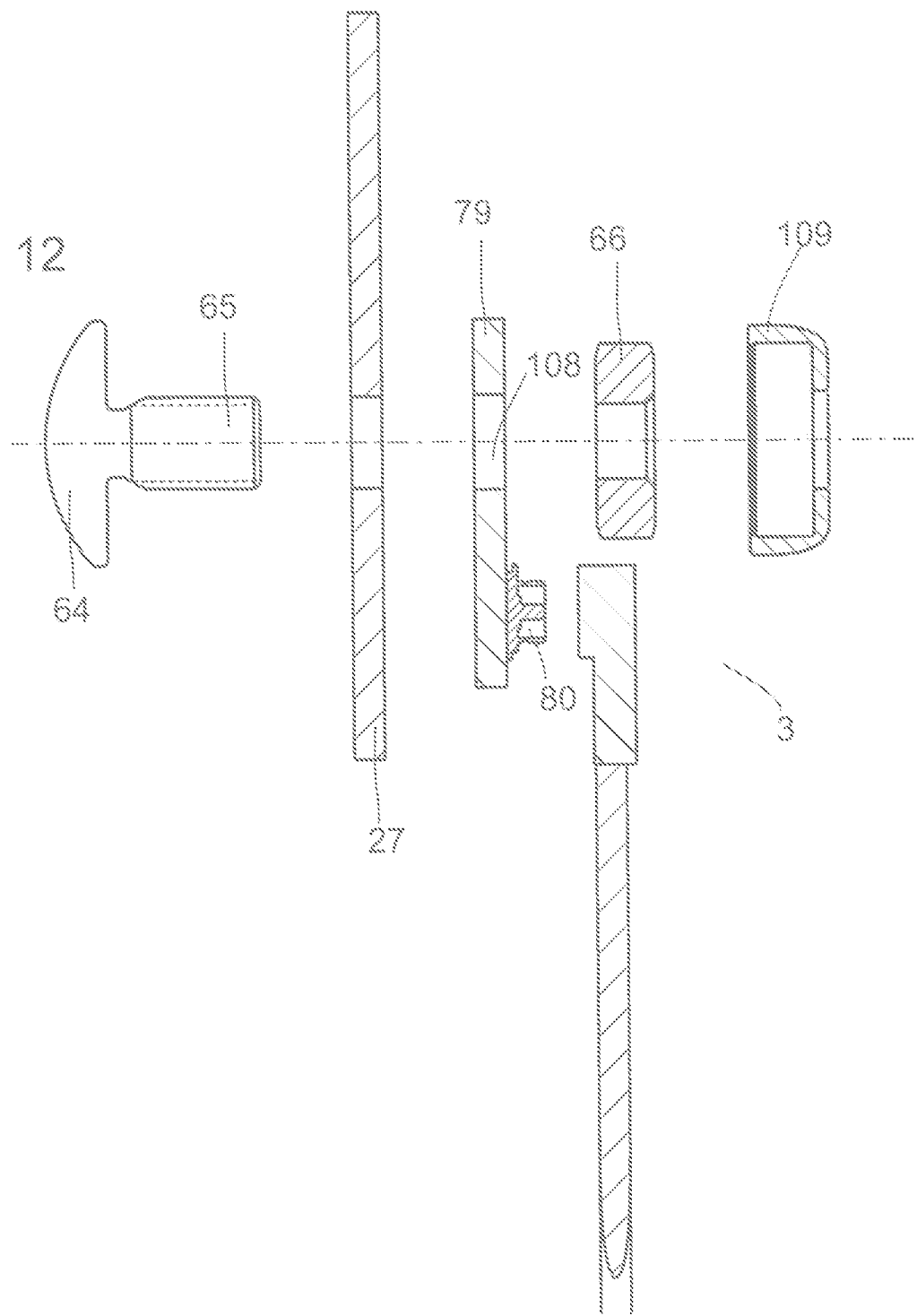

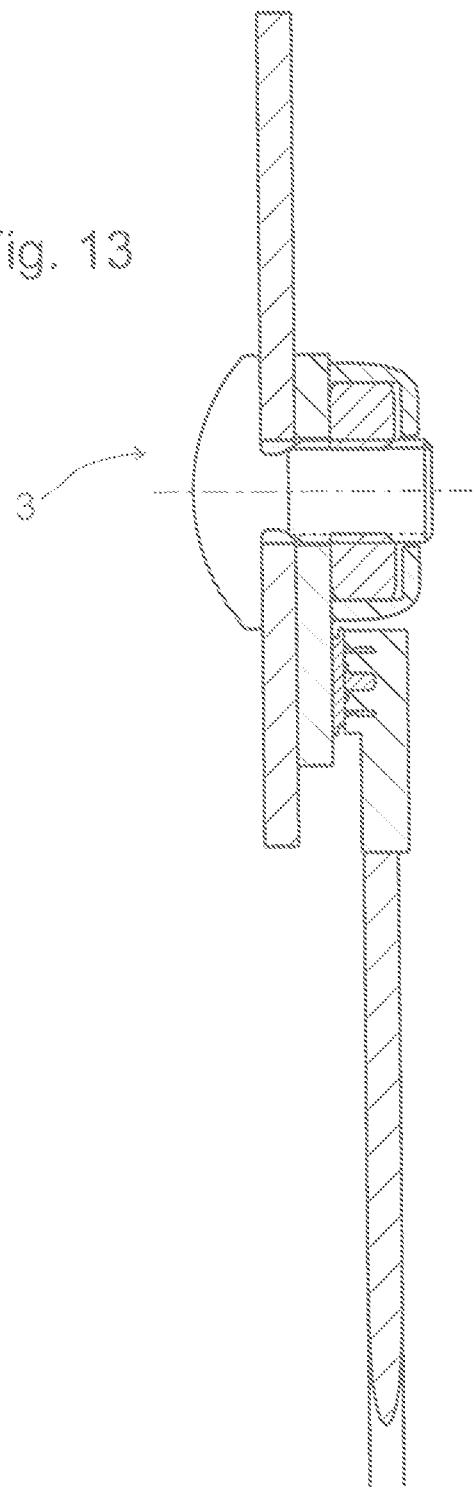

EMG-AMPLIFIER UNIT

THE FIELD OF THE INVENTION

The invention concerns an EMG amplifier unit and an EMG electrode/amplifier unit.

BACKGROUND OF THE INVENTION

Electromyograph EMG electrodes can be used to obtain muscle potentials and can control prostheses based on these muscle potentials. Hereby, electrically conducting objects, such as surfaces or needles, are attached to or into the skin of a muscle of the prosthesis user, to collect electric muscle potentials, such as movement potentials, which are created in the muscle during a muscle contraction.

These registered muscle potentials can be forwarded to a control unit of a prosthesis and hereby used to control the prosthesis. Therefore, the prosthesis can here, for instance by means of one or several contractions of the arm muscle, either open or close a hand or arm prosthesis. Also, the prosthesis can be designed that the control unit can differentiate between a signal which is produced through a single contraction of the muscle and a signal which is produced through several contractions and, therefore, based on a different numbers of contractions, it can execute different movements of the prosthesis and/or the prosthesis can be brought into a different operating condition.

Generally at least two EMG electrodes are used for the collection of muscle movement potentials to control the prostheses. These EMG electrodes have each at least two contact surfaces, which can be placed on the skin of the user. These electrodes are usually connected with a preamplifier which amplifies be registered signals or amplifies the difference of the captured signals and then forwards to an additional amplifier. Hereby, the pre-amplifier and the EMG electrodes from a single device.

SUMMARY OF THE INVENTION

The task of the invention is to develop further EMG amplifier units to control prostheses. It can also be the task to design the EMG amplifier units and/or EMG electrode amplifier units to be more comfortable.

This task is solved through an EMG amplifier unit and/or an EMG electrode/amplifier unit according to the independent claim(s). Special embodiments are part of the dependent claims.

The task is solved, in particular, through an EMG amplifier unit which is placed at or in a prosthesis stem, whereby the EMG amplifier unit comprises: an enclosure, further comprising an enclosure inner space which is defined by the enclosure walls, a first input signal contact group to connect the EMG amplifier unit with at least a second EMG electrode pair, an output signal contact group for a direct and/or indirect connection of the EMG amplifier unit with a prosthesis control, a signal amplifier, a signal processing device, whereby the input signal contacts of the first input signal contact group are at least electrically connected with one signal input of the signal amplifier, and the input signal contacts are electrically connected with at least an additional signal input of the amplifier, whereby at least an output signal of the signal amplifier is connected with the signal input of the signal processing device, and the signal amplifier in the signal processing device are positioned in the inner space of the enclosure.

The first input signal contact group can hereby have two input signal contacts, the second input signal contact group can have two input signal contacts.

The input signal contacts of the first input signal contact group and the input signal contacts of the second input signal contact group can be connected, in particular electrically connected, with a signal amplifier, in particular with a digital amplifier, such as a digital measuring amplifier.

The amplifier can hereby have several channels and, in particular, the input signal contacts of first input signal contact group are at least partially connected with a first amplifier channel, and/or the input signal contacts of the second signal contact group at least partially with a second amplifier channel.

The reference contact of the first input channel contact group and/or the reference contact of the second input signal contact group can be electrically connected with the signal amplifier.

The amplifier can hereby have a first input signal channel and a second input signal channel. The signal input of the first input signal channel can electrically be connected with the first input signal contact group. The signal input of the second input signal channel can be electrically connected with a second input signal contact group.

The amplifier can have a signal output, in particular a digital signal output. The additional signal output can be an electrically connected with the signal input of a digital signal processor.

The EMG amplifier unit can hereby serve to amplify and/or process signals such as EMG signals or also signals derived from it and then sent the signals hereby to an additional processing stage. The output signals of the additional processing stage can be forwarded to a prosthesis control and they can control the prosthesis based on these output signals. Also, the output signals from the EMG amplifier unit can be directly sent to the prosthesis control of the prosthesis.

A connection here is meant a direct or indirect connection which is designed for signal transfer. Such a connection can be designed to transmit electrical, magnetic, electro-magnetic, or optical signals.

In particular, the EMG amplifier unit and/or the EMG electrode/amplifier unit can be designed in a way that the first input signal contact group and/for the second input signal contact group are connected with the EMG electrode in a way so that the signal, which is received on the skin of the prosthesis user, is transferred to the input signal contact group, in particular transferred as non-amplified.

A prosthesis can hereby be an exoprosthesis, in particular a prosthesis which fully or partially replaces an upper or lower extremity. Therefore, a prosthesis can, for instance, be an arm prosthesis, a lower arm prosthesis, a hand prosthesis, a partial hand prosthesis, a finger prosthesis, or a partial finger prosthesis. A prosthesis can further also be understood as an orthosis. An orthosis is an elbow orthosis, a wrist orthosis, or a hand orthosis, but is also a leg orthosis.

A prosthesis stem can hereby understood as an element which holds the prosthesis at the body of the user.

Such a prosthesis stem can. for instance. be formed conically, as cylinder, or anatomically and cover a body part such as an upper arm, a lower arm, a wrist, and/or parts of the hand.

The prosthesis can hereby be positioned at the prosthesis stem, in particular fastened. In particular, the prosthesis can be positioned at an end, in particular the distal end of the prosthesis stem.

It was, therefore, recognized that the EMG amplifier unit can be designed in a way that it can be accommodated in the prosthesis stem or at the prosthesis stem. Hereby, the EMG amplifier unit can be placed close to the EMG electrodes, in particular the recording location of the EMG signals and can, therefore, reduce a signal attenuation and/or a loss of signal of the EMG signals during the signal transfer.

It was also recognized that, through the use of an EMG amplifier unit or several EMG electrode pairs, the amplifier unit can be designed as compact so that the EMG amplifier unit can be positioned easier in or at the prosthesis stem.

In particular, the EMG amplifier unit can be positioned at the inner side of the prosthesis stem, for instance, in a way that the amplifier unit does not get in touch with the skin of the prosthesis user. Therefore, the EMG amplifier unit can be positioned in a part of the prosthesis stem which is not filled by a body part of the prosthesis user.

The EMG amplifier unit can also be positioned at the wall of the prosthesis stem and, therefore, at least be partially surrounded by the prosthesis stem. Thus, the EMG amplifier unit can be held in position through the prosthesis stem and also be protected from environmental impacts.

The EMG amplifier unit can also be positioned at the outer side of the prosthesis stem and, therefore, guarantee more space in the prosthesis stem.

In particular, the first input signal contact group and the second input contact signal group can have each a first and a second input signal contact, whereby with the signal which is present at the first input signal contact and the signal which is present at the second input signal contact, a differential signal is created whereby the differential signal is used to control the prosthesis.

Preferably, the first input signal contact group and/or the second input signal contact group has a reference contact. Thus, the potential between the first input signal contact and the reference contact, and between the second input signal contact and the reference contact in each be measured or both input signal contact groups and herewith accomplish an interference-free measurement.

Also, a common reference contact for both or several input signal contact groups can be used.

Also, a shielding contact can be assigned to each input signal contact or single input signal contacts, whereby the shielding contact can be connected with a shield of at least one signal conductor against electromagnetic radiation. Thus, the signal conductor can be a coaxial cable and the shielding contact is connected with the outer shell of the coaxial cable.

In particular, the EMG amplifier unit can have an enclosure and the first input signal contact group and/or the second input signal contact group in the positioned at this enclosure. Also, a ground contact can be present at the enclosure.

It was, therefore, recognized that with an EMG amplifier unit with two EMG measurement inputs, through a common electronic circuit board, and in particular with a common measurement amplifier and common micro controller, as well as a common enclosure for several electrodes, the EMG amplifier unit can be designed as even more compact and therefore the EMG amplifier unit can be positioned more comfortable for the prosthesis user.

In particular, the enclosure of the EMG amplifier unit can be designed with an electrically isolating material, preferably which is also and in addition a shielding material. Such material can be, for instance, a wire mesh which is embedded in plastic or an electrically conducting coating.

In particular, the enclosure of the EMG amplifier unit can be designed as rigid or at least as a robust, flexible material such as silicone and it therefore protects the elements which are positioned inside of the enclosure from mechanical impacts. In addition, a rigidly designed enclosure can also contain elements which can be accessed from outside of the enclosure.

In particular, the EMG amplifier unit can have a circuit board on which the first input signal contact group and the second input signal contact group are positioned. The EMG amplifier unit can be designed as more compact, through the use of a circuit board, as compared to EMG amplifier units which have a circuit board for each input signal contact group, or compared to EMG amplifier units where the signal processing devices and the signal amplifier are each on separate circuit boards, and each of these circuit boards have to be separately positioned.

The EMG amplifier unit can have a lighting source which indicates the strength of one of the input signals and/or the strength of an output signal. Thus, it can be determined, for instance, based on the EMG amplifier unit whether the input signal strength and/or the output signal strength are in an reasonable range or whether the signal amplification needs to be adjusted.

In particular, each output signal contact group can have an assigned lighting source, where the lighting source displays the signal strength of the output signal. Thus, a compact indicator part can be realized to visualize the output signal level.

The lighting source can hereby comprise of one or several LEDs, single color or multicolor, or RGB LEDs, respectively.

Preferably, the color of the lighting source, the light intensity of the lighting source, and/or the flashing frequency can be matched, as required, with the signal strength. This enables an intuitive presentation of the signal strength. Therefore and for instance, a LED can be used which can provide light with different colors. Such LED can for instance output a blue color when the signal strength is too low, while output a red color if the signal strength is too high.

The EMG amplifier unit preferably has exactly two input signal contact groups in addition to other output signal contact groups and/or input contact groups. An EMG electrode can be placed on a flexing muscle and a second electrode on the opposing stretching muscle and the prosthesis can be controlled by tensing one or the other muscle.

Through the reduction of exactly two input signal contact groups, the EMG amplifier unit can be designed compact so that it can be positioned in a small child hand prosthesis and/or in a prosthesis stem of a partial hand prosthesis. It was also recognized here, through the use of exactly two electrodes, that the prosthesis can be controlled through a respective stretching and/or bending of a body part. It was recognized through the use of a digital signal processor that the timing relation of the two input signals, which are provided by both electrodes to the digital signal processor, can be calculated and, therefore, by means of a compact EMG amplifier the signal pattern of the respective muscle can be recognized and be correlated to each other.

It is, therefore, possible to control the prosthesis in a way that a large number of different movements of the prosthesis become possible, interference signals can be identified and minimized particularly well.

Preferably, the EMG amplifier unit can have a button to alter the amplification of at least one input signal. Therefore and through pressing a button, the amplification can be increased to a certain value, for instance, and through an additional pressing of the button the amplification can be reduced beyond this value. It also enables a compact design of an EMG amplifier unit with a variable amplification.

The task is also solved through an EMG electrode/amplifier unit, comprising an EMG amplifier unit as presented above and at least an EMG electrode for the receiving of EMG signals.

Preferably, the EMG electrode comprises a contact surface for the placement on the skin and a flexible signal cable of the transport of the EMG signals, which are received by the contact surface, to the EMG amplifier unit.

Preferably, the EMG electrode comprises two contact surfaces, isolated from each other, and two signal cables, whereby the first signal cable transmits an EMG signal from the first contact surface to the first input signal contact, and the second signal cable transmits an EMG signal of the second contact surface to the second input signal contact.

In particular, the first contact surface and the second contact surface can be mechanically connected with each other through a flexible carrier material.

In particular, a reference contact surface can be positioned between the first and the second contact surface which is electrically connected through an additional electric wiring with the reference contact.

It was hereby recognized that the signal amplifier and the signal processing device for two EMG channels are placed on a circuit board and in an enclosure, a compact EMG electrode with EMG signal inputs can therefore be realized.

BRIEF DESCRIPTION OF THE DRAWINGS

Furthermore, the invention is explained based of an embodiment example through the drawings. Hereby shows FIG. 1 a first EMG electrode/amplifier unit as top view,
FIG. 2 a first EMG electrode/amplifier unit as side view,
FIG. 3 a second EMG electrode/amplifier unit with an output signal wiring,
FIG. 4 a third EMG electrode/amplifier unit as top view,
FIG. 5 a third EMG electrode/amplifier unit as side view,
FIG. 6 a fourth EMG electrode/amplifier unit as top view,
FIG. 6a a fourth EMG electrode/amplifier unit as side view,
FIG. 7 an EMG electrode in an exploded view drawing,
FIG. 8 the EMG electrode in an assembled condition,
FIGS. 9a, 9b a fifth EMG amplifier unit in different perspectives,
FIG. 10 the fifth EMG amplifier unit with an EMG electrode in a sectional view,
FIG. 10a the fifth EMG electrode/amplifier unit without cover,
FIG. 11 the fifth EMG electrode/amplifier unit as top view,
FIG. 11b the fifth EMG electrode/amplifier unit as side view,
FIG. 11c the fifth EMG electrode/amplifier unit as diagonal from the top,
FIG. 11d the fifth EMG electrode/amplifier unit as top view,
FIG. 12 a second EMG electrode in an exploded view drawing,
FIG. 12b in a perspective presentation,
FIG. 13 the second EMG electrode in an assembled condition,
FIG. 14 a hand prosthesis with a EMG electrode-/amplifier unit,
FIG. 15 a sixth EMG amplifier unit,
FIG. 16 a hand prosthesis with a motor, control and EMG amplifier unit,
FIG. 17 a second hand prosthesis with an EMG electrode-/amplifier unit.

DETAILED DESCRIPTION OF THE PREFERRED EMBODIMENTS

Figure 1:
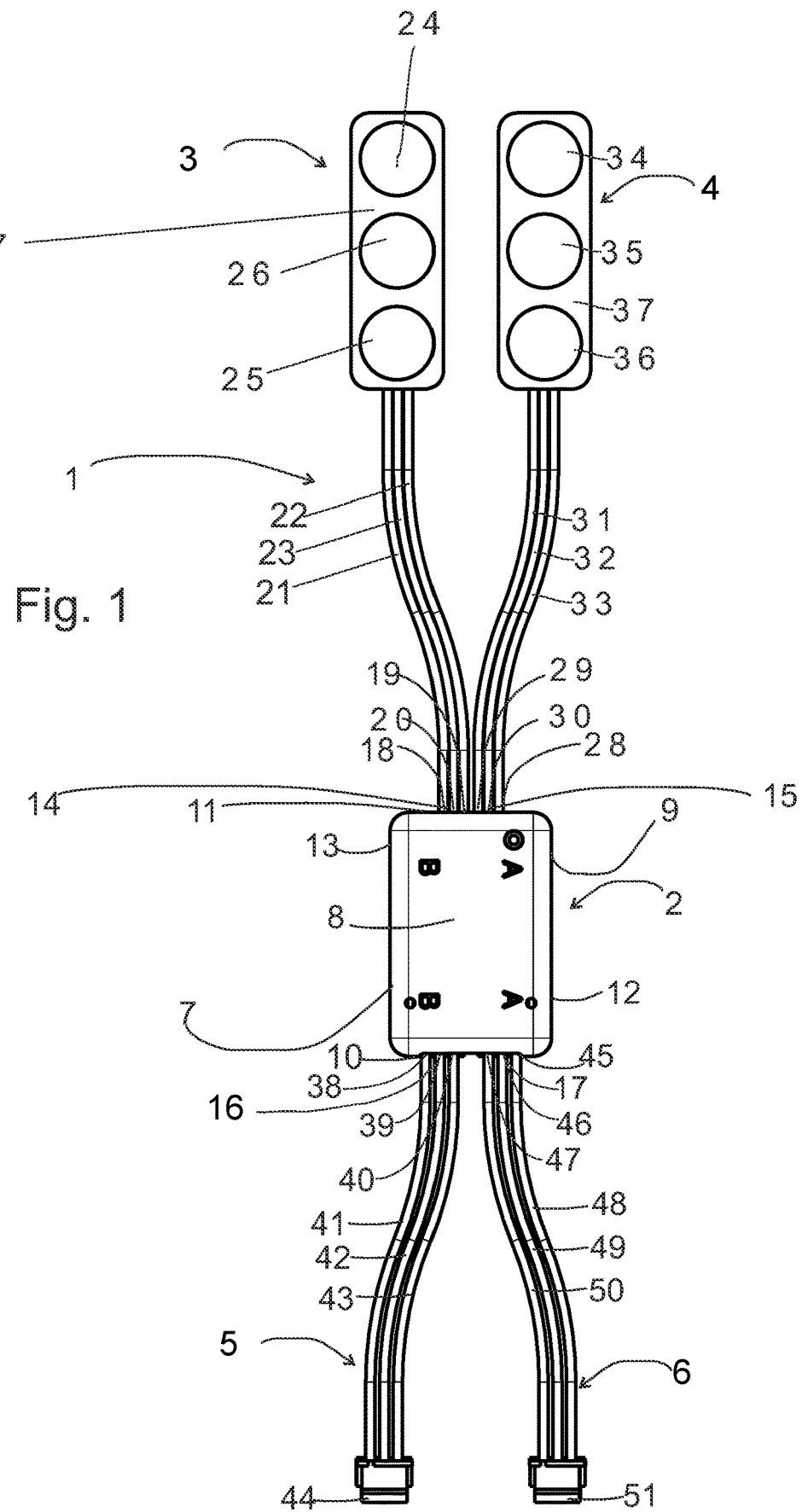

FIG. 1 shows an EMG Electrode amplifier unit 1 with an EMG an amplifier unit 2, a first EMG electrode 3, a second EMG electrode 4, a first output cable 5 and a second output cable 6.

The second EMG amplifier unit 2 has an enclosure 7 which has a rigid design and can be made from plastic. The enclosure 7 has a top side 8, a bottom side 9, a front side area 10 and a back side area 11, a right side area 12 and a left side area 13.

A first input signal contact group 14 and a second input signal contact group 15 are positioned at the back side area 11.

The input signal contact group 14 comprises a first input signal contact 18, a second input signal contact 19, and a first reference contact 20. The first input signal contact 18 is in electric contact with the first input signal wiring 21 of the first electrode 3, the second input signal contact 19 is in electric contact with the second input signal wiring 22 of the first electrode 3 and the reference contact 20 is in an electric contact with the reference wiring 23 of the first electrode 3.

The first input signal wiring 21 has an electric contact with the first signal contact surface 24. The first signal contact surface 24 is hereby suitable to be placed on the skin of the prosthesis user to derive a movement potential of a muscle.

The second input signal wiring 22 is in electric contact with the second signal contact surface 25. The second signal contact surface 25 is also be positioned on the skin of the prosthesis user and derives a movement potential at a different location of the same muscle.

The reference wiring 23 is in electric contact with a reference signal contact surface 26 which is located between the first signal contact surface 24 and the second signal contact surface 25. The reference signal contact surface 26 also receives reference signals from the skin of the prosthesis user.

The first signal contact surface 24, the second signal contact surface 25, and the reference signal contact workers 26 are mounted on an especially flexible carrier surface 27, so that the contact surfaces 24, 25, and 26 has a defined distance from the skin of the prosthesis user.

The second input signal contact group 15 has a first input signal contact 28, a second input signal contact 29 and a reference contact 30. The second electrode 4 comprises a first input signal wiring 31, a second input signal wiring 33, and a reference wiring 32. The first input signal contact 28 is in electric contact with the first input signal wiring 31 of the second electrode 4, the second input signal contact 29 is in the electric contact with the second input signal wiring 33 of the second electrode 4, and the reference contact 30 is in electric contact with the reference wiring 32 of the second electrode 4.

The first input signal wiring 31 is in electric contact with the first signal contact surface 34. The first signal contact surface 34 is suitable for being applied to the skin of the prosthesis user and for deriving an action potential of a muscle.

The second input signal wiring 33 is in electric contact with a second signal contact surface 36. The second signal contact surface 36 can also be applied to the skin of the prosthesis user to derive a movement potential of the same muscle at a different location.

The reference wiring 32 is in electric contact with a reference signal contact surface 35 which is located between the first signal contact surface 34 and the second signal contact surface 36. The reference signal contact surface 35 receives reference signals from the skin of the prosthesis user.

The first signal contact surface 34, the second signal contact surface 36, and the reference signal contact surface 35 are mounted on a particularly flexible carrier surface 37 so that the contact surface 34, 35, and 36 have a defined distance from skin of the prosthesis user.

A first output signal contact group 16 and a second output signal contact group 17 are positioned at the front side surface 10 of the enclosure 7. The first output signal cable 5 is in electric contact with the output signal contact group 16, and the second output signal cable 6 is in electric contact with the second output signal contact group 17.

The output signal contact group 16 comprises a first output signal contact 38, a second output signal contact 40, and an output reference contact 39. The first output signal contact 38 is in electric contact with a first output signal wiring 41, the second output signal contact 40 is in electric contact with the second output signal wiring 43, and the output reference contact 39 is in electric contact with the output reference wiring 42.

A plug 44 is provided, at the distal end of the output signal wiring 40, 42 and the output reference wiring 42, to connect the output signal cable 5 with an additional signal processing element, such as the prosthesis control.

The second output signal contact group 17 comprises a first output signal contact 45, a second output signal contact 47, and an output reference contact 46. The first output signal contact 45 is in electric contact with a first output signal wiring 48, the second output signal contact 47 is in electric contact with a second output signal wiring 50, and the output reference contact 46 is in electric contact with an output reference wiring 49.

A plug 51 is provided, at the distal end of the output signal wiring 48, 50 and the output reference wiring 49, to connect the output signal cable 6 with an additional signal processing element, such as the prosthesis control.

Figure 2:
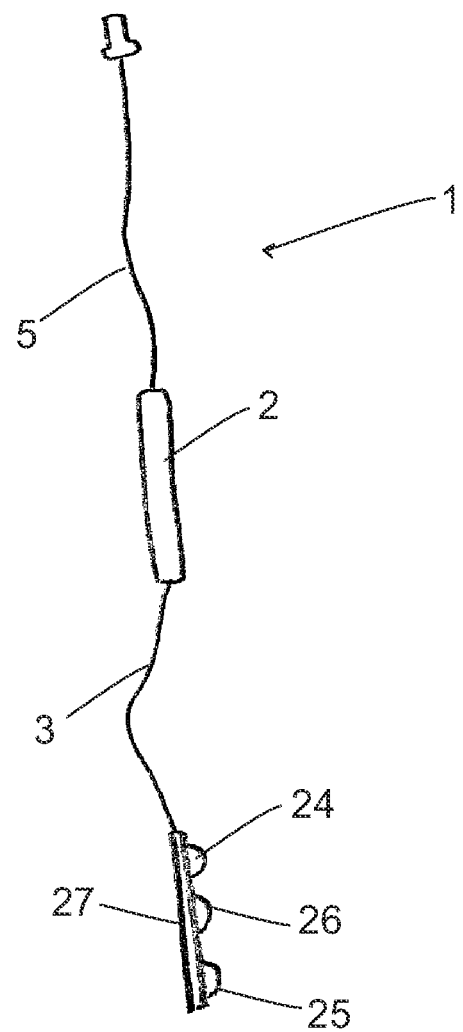

FIG. 2 shows the EMG electrode/amplifier unit 1 from the side. It can be seen in the contact surfaces 24, 25, 26 are above the carrier surface 27 so that the electric contact, between the contact surfaces 24, 25, 26 and the skin of the prosthesis user, are reliably achieved.

Figure 3:
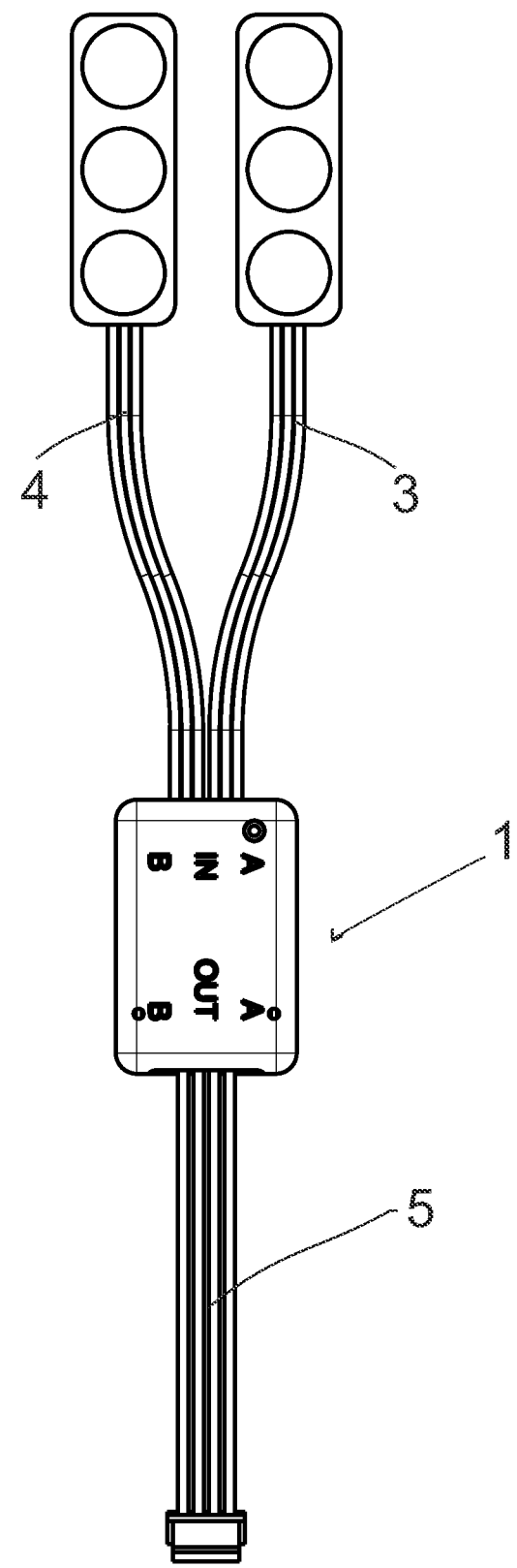

FIG. 3 shows an additional EMG electrode/amplifier unit 1 from the front, whereby the input signal wiring 21, 22 and the input signal wiring 31, 33 and the respective reference wiring 23, 32 are provided in their proximal ends 52, 53, 54, 55, 56, 57 with contact rings 58, 59, 60, 61, 62, 63, which are in electric contact with the respective wiring 21, 22, 23, 31, 32, 33. The contact rings 58, 59, 6B, 61, 62, 63 can hereby be used to achieve an electric contact with the respective contact surfaces 21, 25, 26, and 34, 35, 36.

FIG. 5 shows such an EMG electrode/amplifier unit 1 from the side.

FIG. 6 shows an EMG electrode/amplifier unit 1 from the front with two electrodes 3, 4 and a common reference wiring 63. This reference wiring 63 can hereby be in electric contact with a skin location of the prosthesis user, whereby the main place can be between the contact surfaces 24, 25, and 36, 34.

Figure 7:
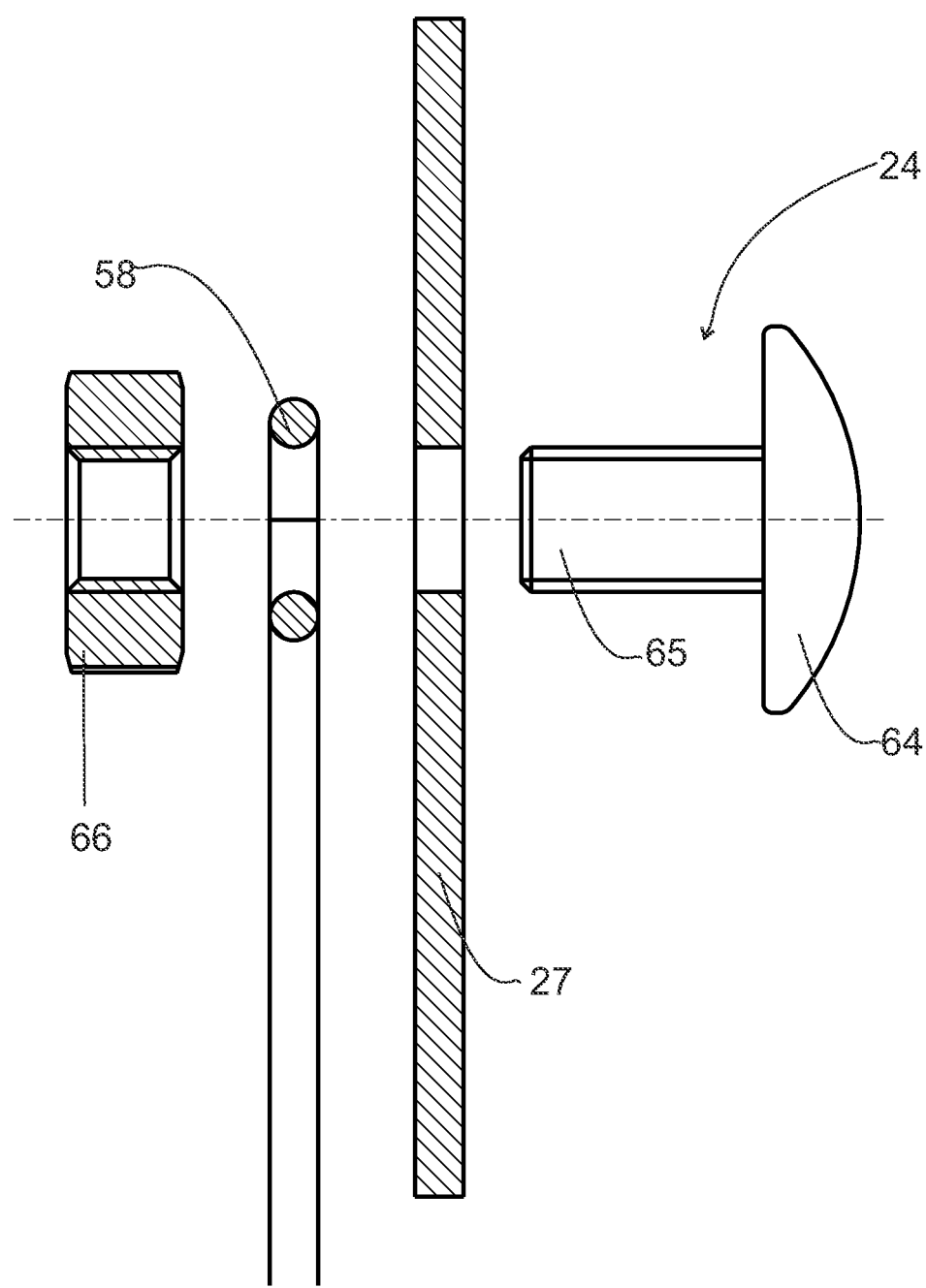

FIG. 7 shows a contact surface 24 which has a contact surface header 64 and a contact surface pin attached thereto. This contact surface header 64 is provided so that it makes contact with the skin of the prosthesis user. The contact surface pin 65 is passed through the carrier surface 27. The contact ring 58 is brought around the contact surface pin 65, at the side of the areas surface which faces a way from the contact surface header 64, and fixed in position between the nut 66 and the carrier surface 27 by means of the nut 66 which meshes with a thread of the contact surface pin 65.

Figure 8:
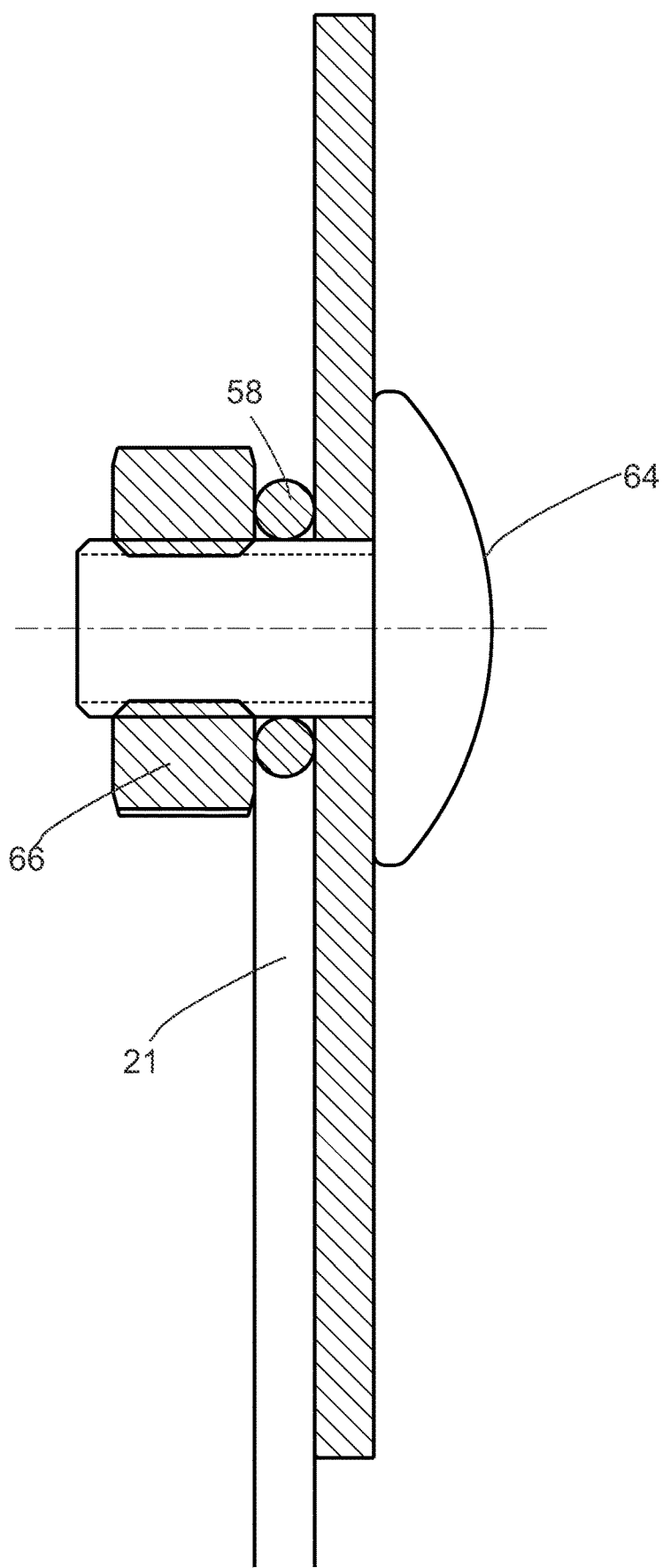

FIG. 8a shows the input signal wiring 21 with the contact ring 58.

FIG. 8b shows the input signal wiring 21 as it is electrically connected with the contact surface header 64.

FIG. 9 shows an EMG amplifier unit 2 comprising a first input signal plug 67, a second input signal plug 68, a third signal input plug 69, a fourth input signal plug 70, a fifth signal input plug 71 and a sixth signal input plug 72. The EMG amplifier unit 2 further comprises a first output signal plug 73 and a second output signal plug 74.

Figure 10:
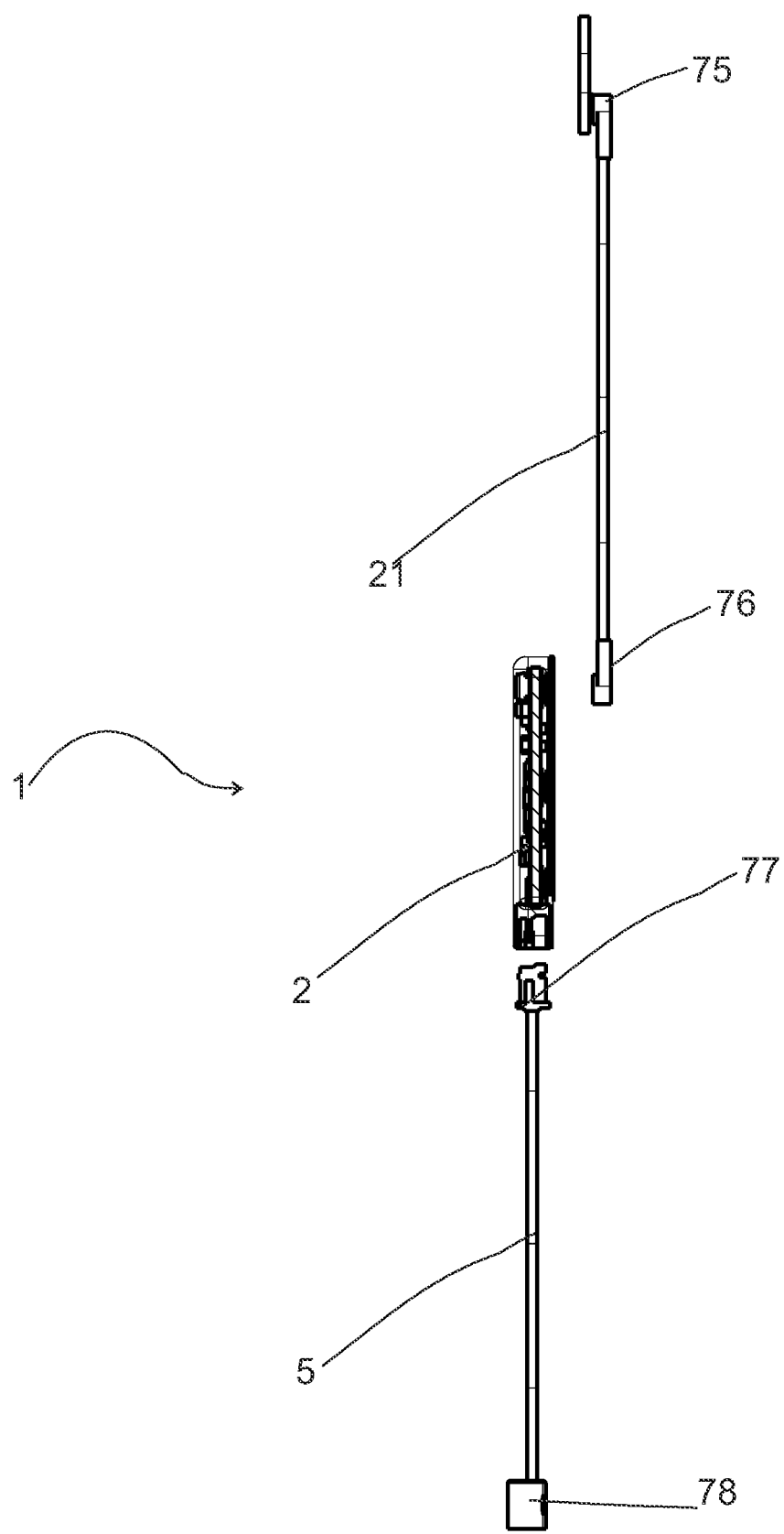
Figure 10:
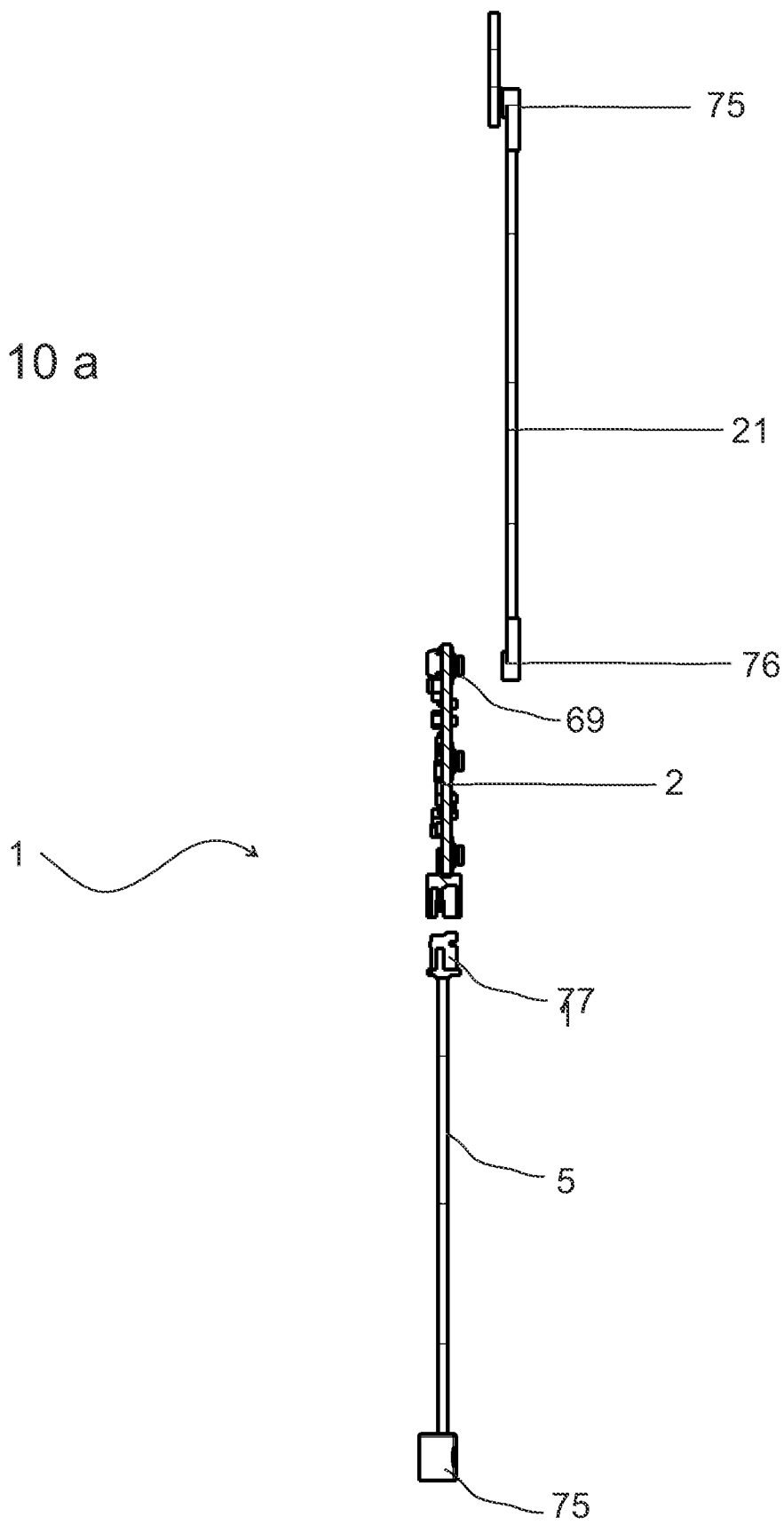

FIG. 10 shows an EMG electrode/amplifier unit 1 with the EMG amplifier unit 2 as in FIG. 9. The EMG electrode/amplifier unit 1 hereby has an electrode 3 and an output signal cable 5. The electrode 3 has an input signal wiring 21 where a plug 75 is positioned, at its proximal end, for the electric connection of the input signal wiring 21 with the contact surface 24. A second plug 76 is position, at the distal end of the input signal wiring 21, for electric connection of the input signal wiring 21 with the input signal plug 69.

The output signal cable 5 has a first plug 77, at its proximal end, for the electric connection of the output signal cable 5 with the EMG amplifier unit 2. The output signal cable 5 has a second plug 78, at its distal end, for the electric connection of the output signal cable 5 with a prosthesis control, for instance.

Figure 11:
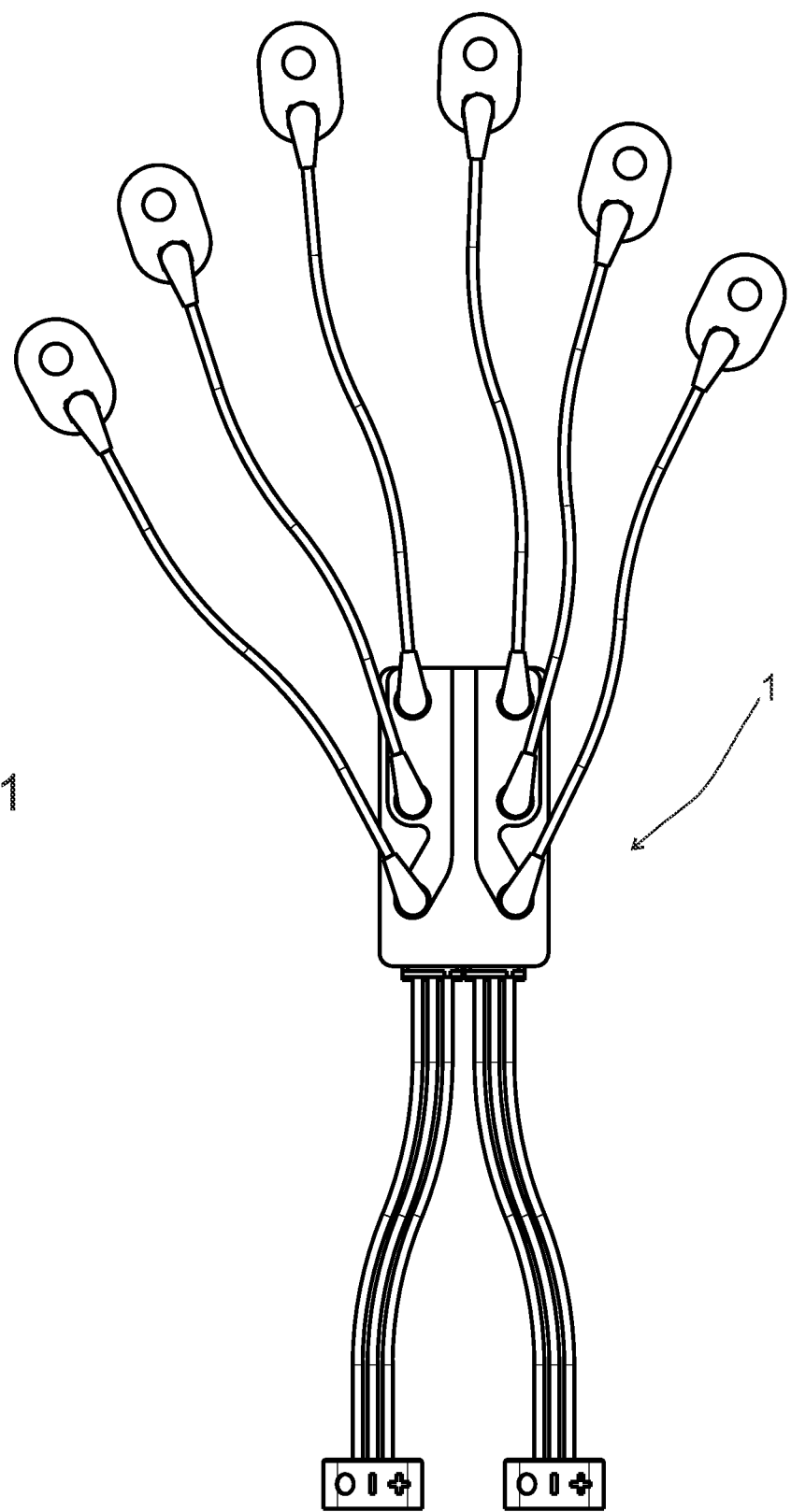
Figure 11:
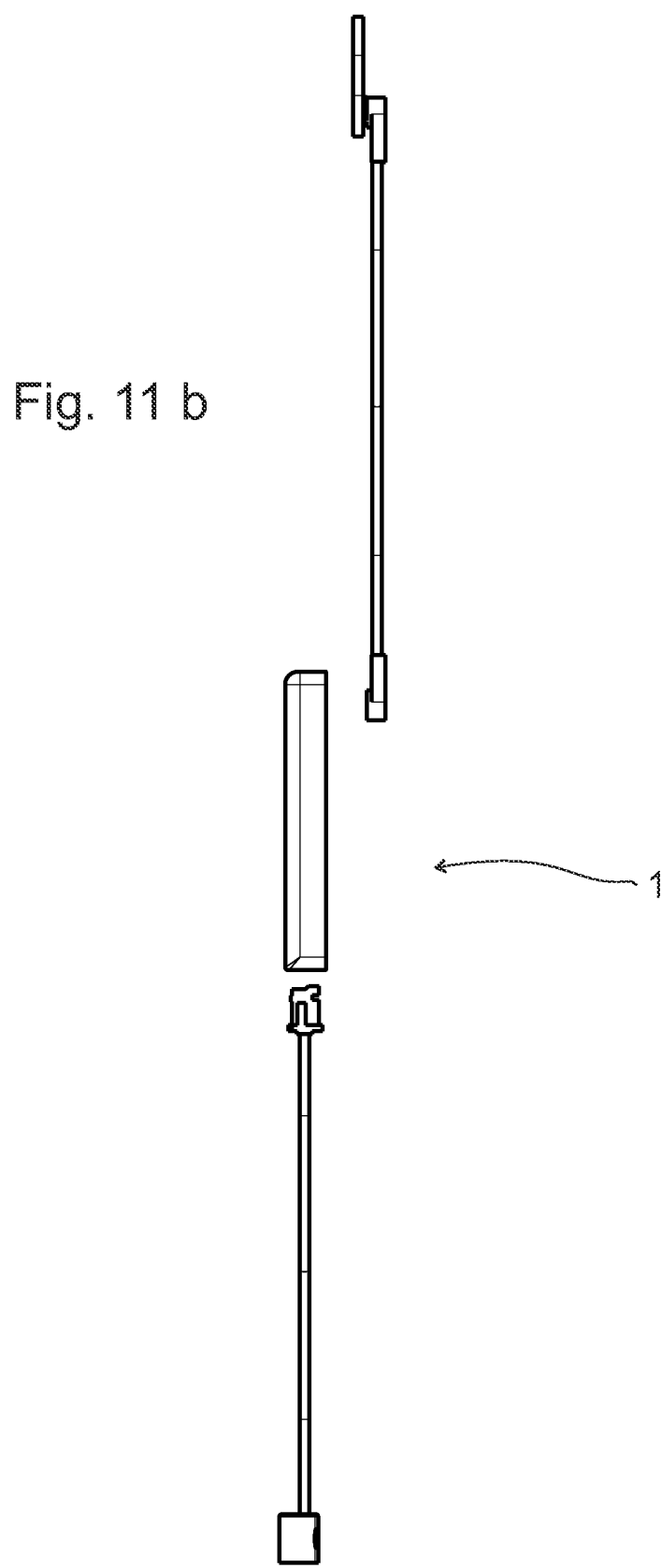
Figure 11C:
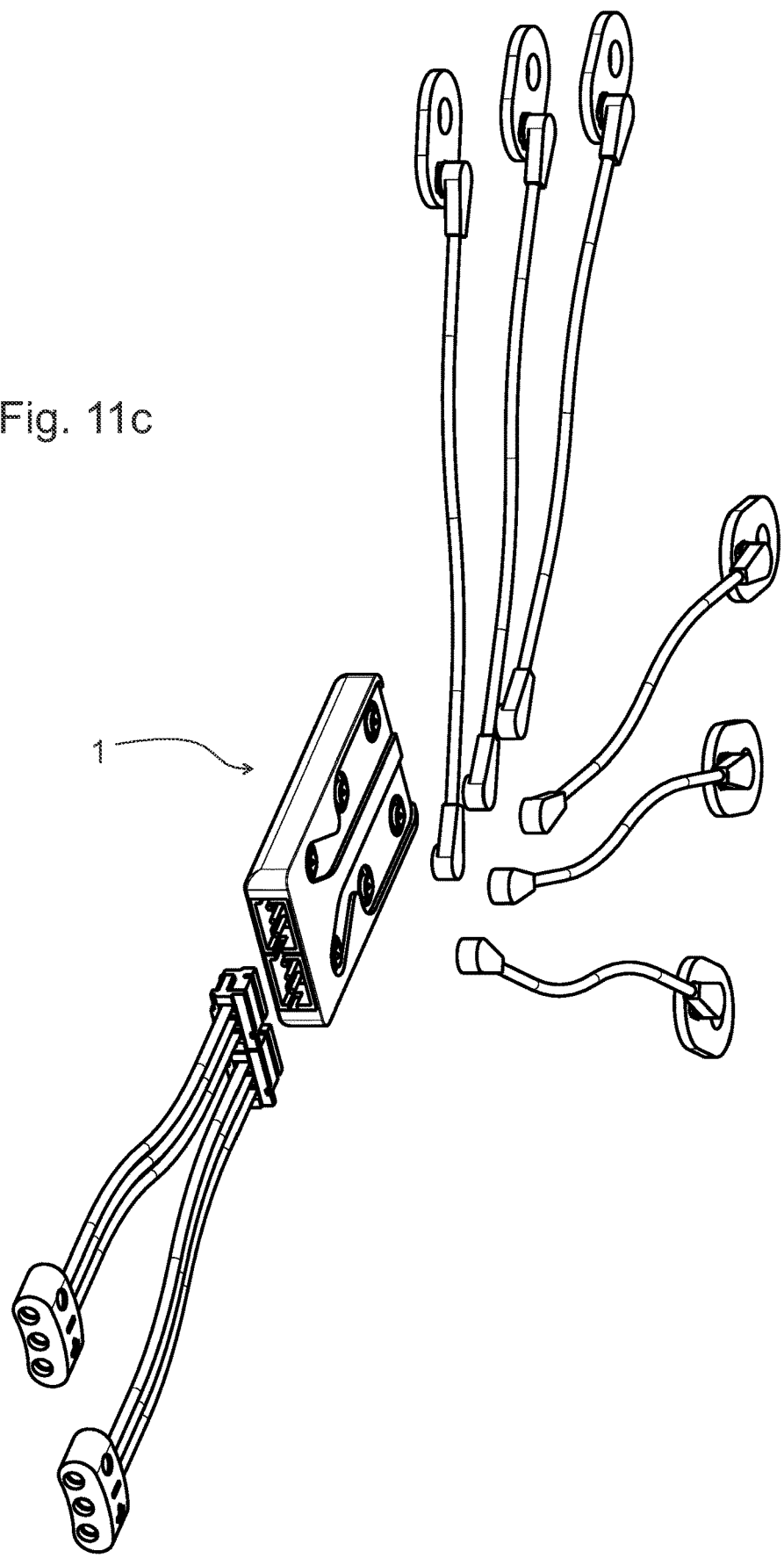
Figure 11:
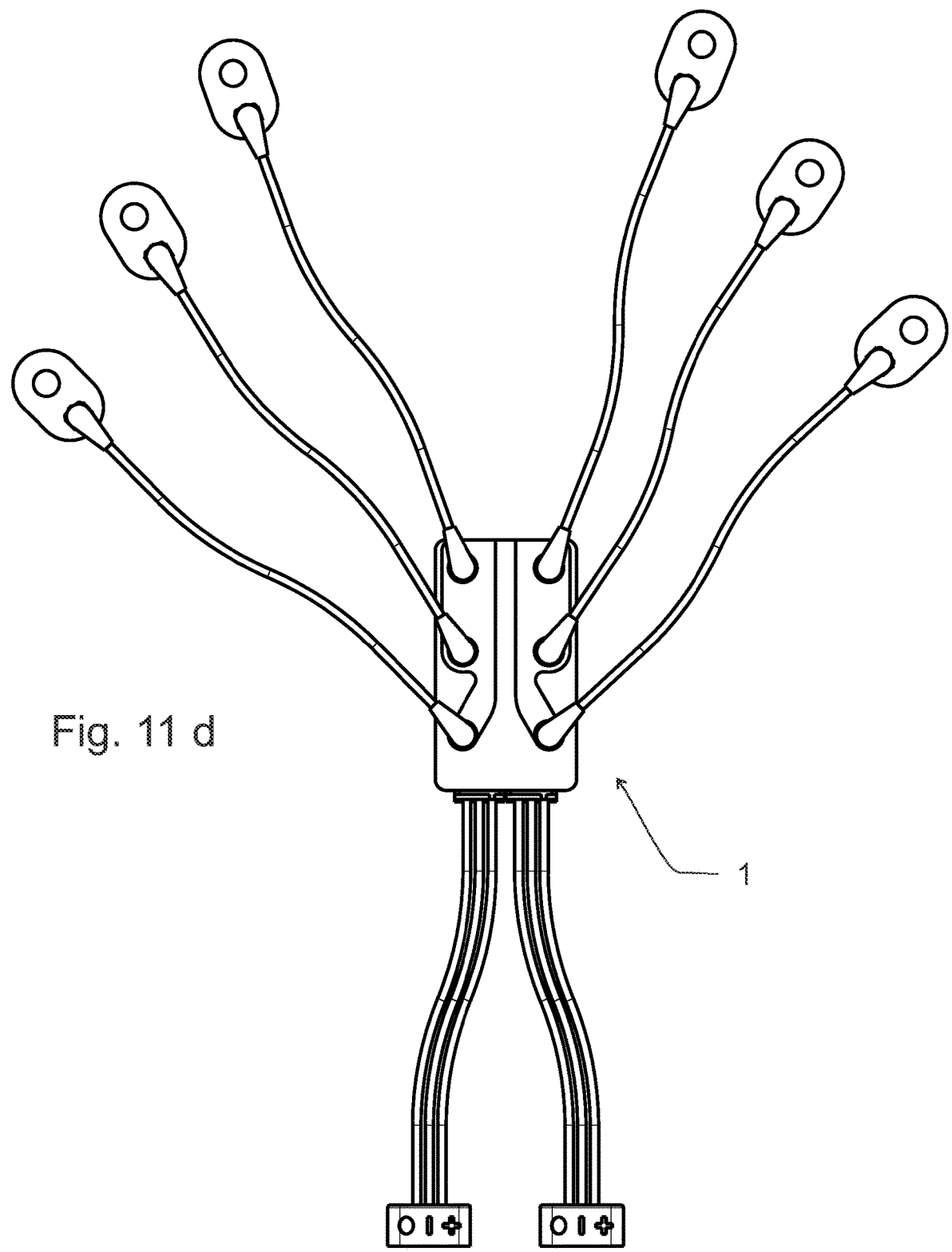

FIG. 11 shows the EMG electrode/amplifier unit 1, as in FIG. 10, in an installed condition.

Figure 12B:
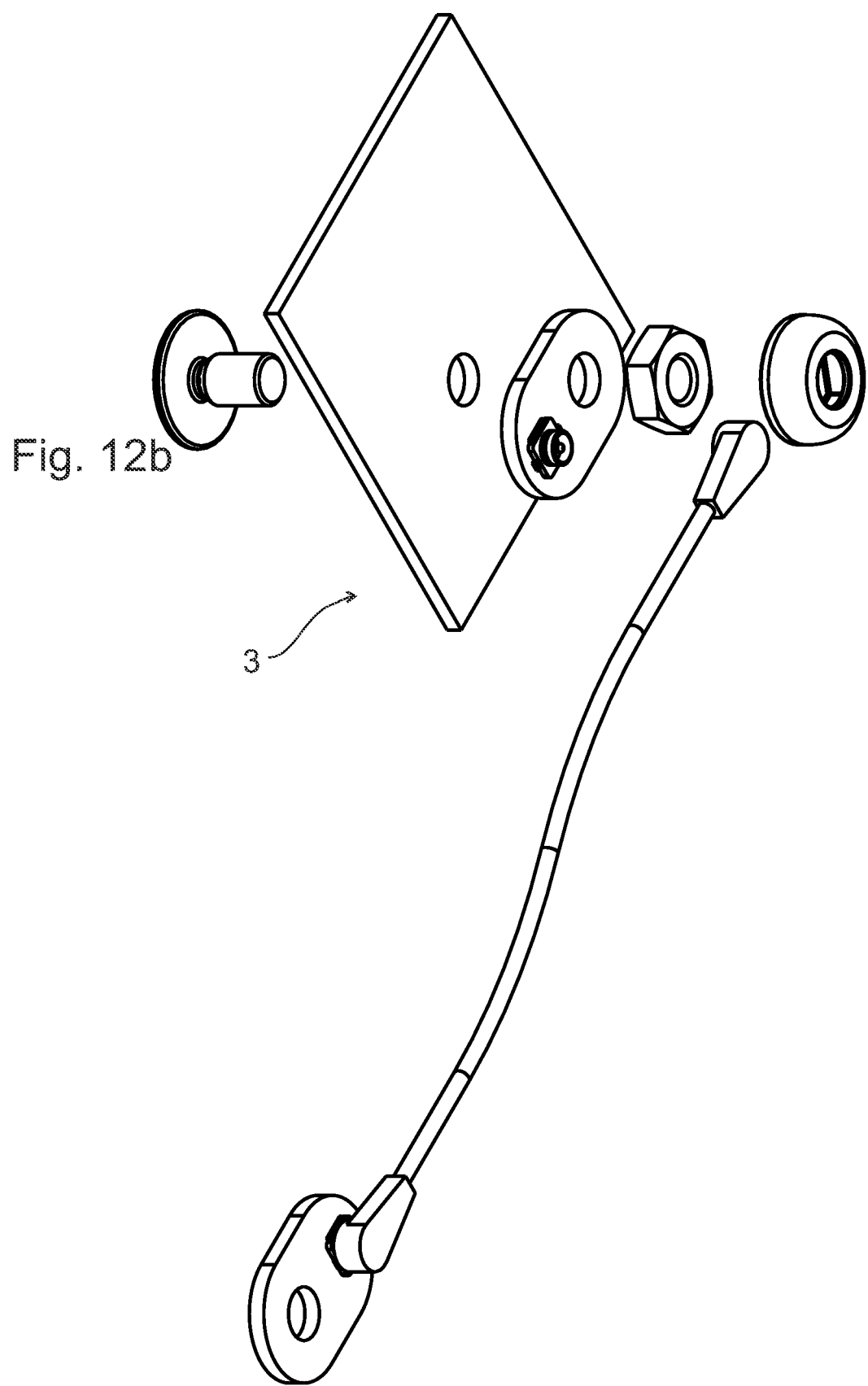

FIG. 12 shows an electrode 3. Hereby, the electrode has a contact surface header 64 and a contact surface pin 65. Whereby the contact surface header 64 is provided to make contact with the skin of the prosthesis user, and the contact surface pin 65 extends though the flexible carrier 27. The contact surface pin 65 hereby has a screw thread. A plugging board 79 is provided, on the side of the carrier 27 which is facing away from the contact surface header 64, and has an opening 108 through which the contact surface pin 65 is brought through. The plugging board 79 is firmly fixed to the flexible carrier 27, via a nut 66 which meshes with the thread of the contact surface pin 65. The plugging board 79 has an electronic plug contact 80 which is compatible with the plug 75 and the proximal end of the input signal wiring 21. A cover 109 can hereby cover the end of the screw and the nut 66.

FIG. 13 shows the electrode 3 in the installed condition.

Figure 14:
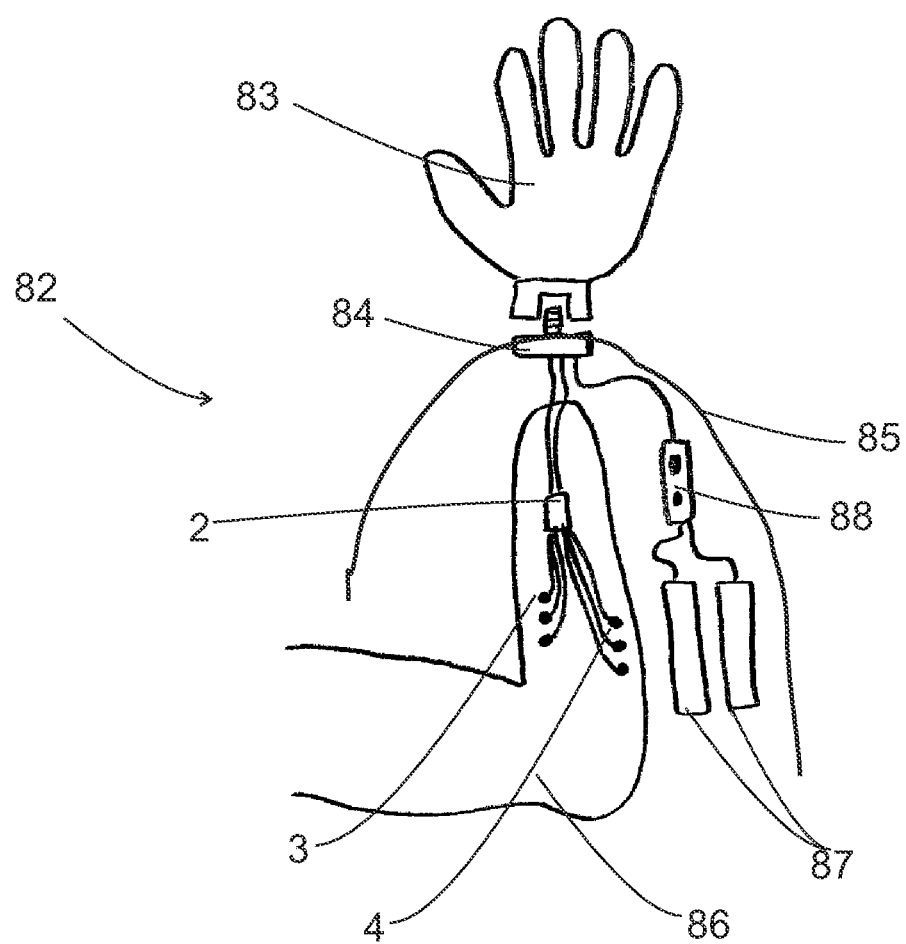

FIG. 14 shows a hand prosthesis 82, comprising a prosthesis hand 83, a prosthesis wrist 84 which connects the prosthesis hand 83 with a prosthesis stem 85. The EMG electrode/amplifier unit 1, with the EMG amplifier unit 2 and the EMG electrodes 3, 4, are located in the prosthesis stem. The contact surfaces 24, 25, 26 and 34, 35, 36 of the electrodes 3 or 4, respectively, are positioned on the skin 86 of the prosthesis user. Also, a battery element 87 is located in the prosthesis stem 85, which is connected with the prosthesis hand 83 via a battery charging element 88.

Figure 15:
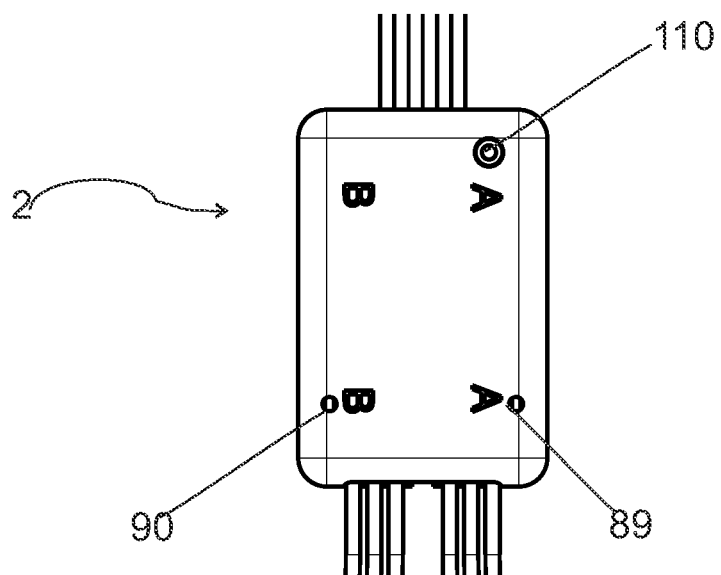

FIG. 15 shows an EMG electrode/amplifier unit 1 which has an EMG amplifier unit 2. The EMG amplifier unit 2 has two LEDs 89, 90 which display the output signal strength.

In addition, the EMG amplifier unit 2 has a button 110 which enables the adjustment of the amplification of the input signals.

Figure 16:
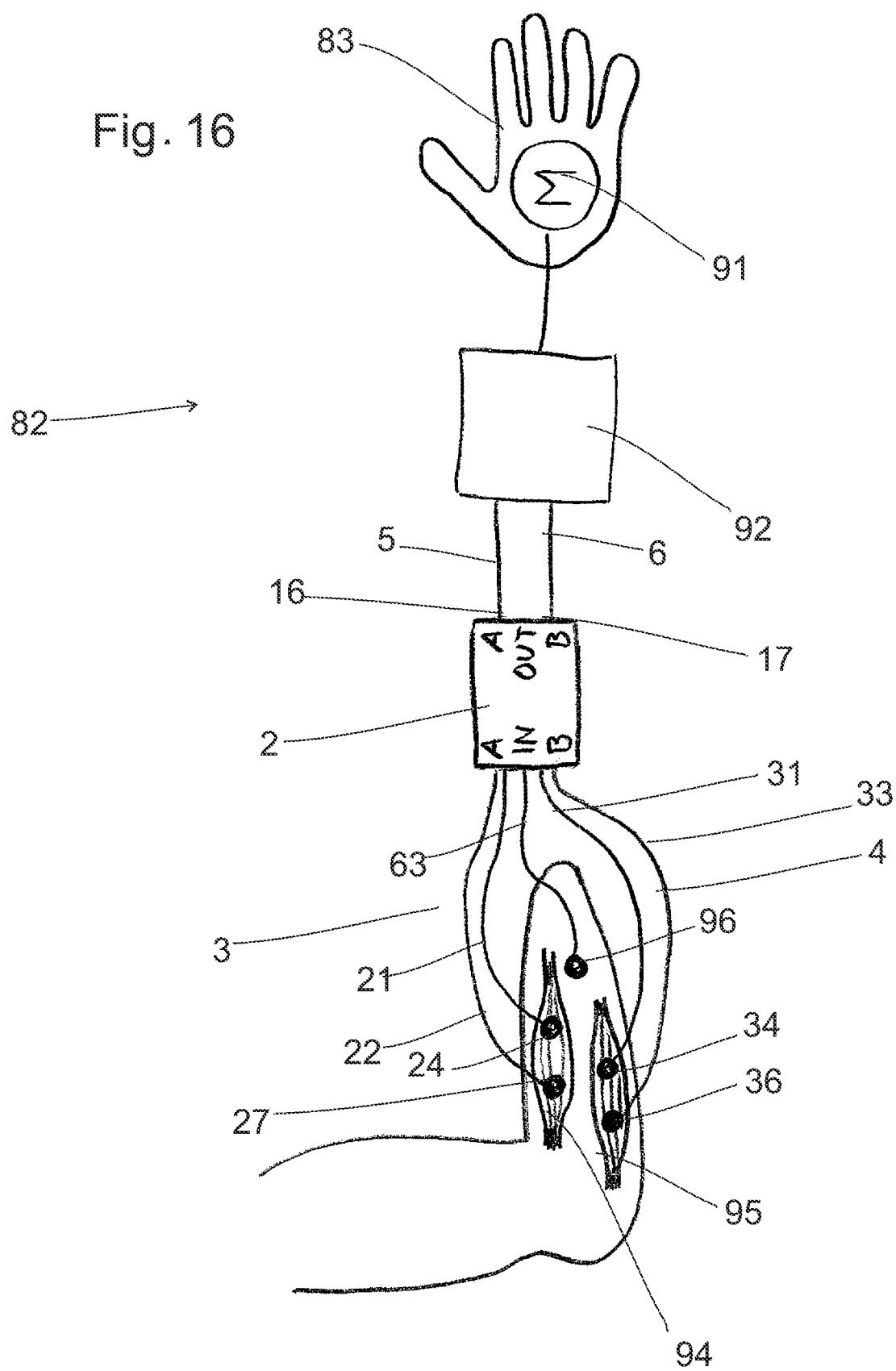

FIG. 16 shows a hand prosthesis 82 whereby the prosthesis hand has one or several motors 91 for the movement of the prosthesis hand 83. The motors 91 are controlled through a prosthesis control 92 which is electrically connected with the motor 91. The prosthesis control 92 is electrically connected with the EMG amplifier 2 through two output signal cables 5, 6, in particular with the output signal contact groups 16, 17.

The input signal contact groups 14, 15 are hereby electrically connected with the electrodes 3, 4, in particular, the input signal wiring 21, 22 are connected with the contact surfaces 24, 27 which are placed on the skin of a muscle 94. The input signal wiring 31, 33 are electrically connected with the contact surface 34, 36 which are placed on a second muscle 95. The reference wiring 63 is electrically connected with the contact surface 96 which is located on the skin of the two muscles.

Figure 17:
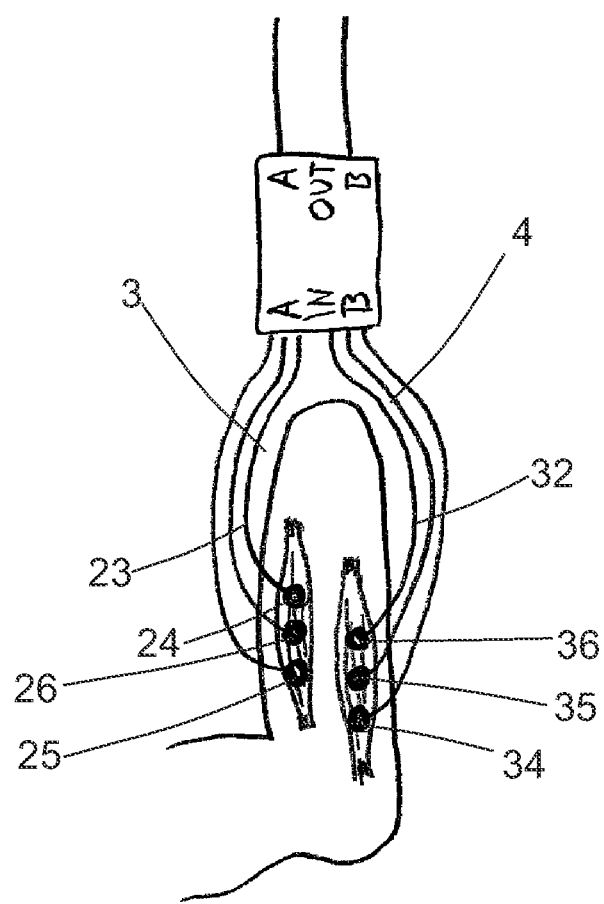

FIG. 17 shows the EMG electrode/amplifier unit, as in FIG. 16, whereby here each electrode 3, 4 is provided with a reference wiring 23, 32, whereby the reference wiring 23, 32 is electrically connected with contact surfaces 26, 35 which are located between the two contact surfaces 24, 25 or 36, 34, respectively.

To avoid repetition, same or similar parts can have identical reference characters.

The invention claimed is:

1. An EMG amplifier unit that is positioned at or in a prosthesis stem, the EMG amplifier unit comprises:
    an enclosure having front and back walls and top and bottom walls that are normal to the front and the back walls and define an inner space, the top and the bottom walls are planar and arranged opposite each other, the front wall is arranged opposite the back wall and forms an output end of the EMG amplifier unit, the top wall has a plurality of input plugs that spaced apart from each other on the top wall, and the front wall has at least one output signal plug;
    a signal amplifier being electrically connected to the plurality of input plugs, the signal amplifier having a signal output that is electrically connected to the at least one output signal plug of the front wall of the enclosure;
    a signal processing device having a signal input and a signal output, the signal input of the processing device is electrically connected to the signal output of the signal amplifier, the signal amplifier and the signal processing device are positioned in the inner space of the enclosure;
    first and second input electrodes, each of the first and the second input electrodes has a first contact surface, a second contact surface and a reference contact surface which are configured to derive a movement potential of a prosthesis user muscle,
        the first contact surface, the second contact surface and the reference contact surface of the first input electrode are aligned such that the reference contact surface is located between the first and the second contact surfaces, and
        the first contact surface, the second contact surface and the reference contact surface of the second input electrode are aligned such that the reference contact surface is located between the first and the second contact surfaces;
    the first input electrode is electrically connected to the EMG amplifier unit by first and second input signal wires and a first reference signal wire, wherein proximal ends of the first and the second input signal wires are electrically connected to the first and the second contact surfaces of the first input electrode, respectively, and a proximal end of the first reference signal wire is electrically connected to the reference contact surface of the first input electrode;
    the second input electrode is electrically connected to the EMG amplifier unit by third and fourth input signal wires and a second reference signal wire, wherein proximal ends of the third and the fourth input signal wires are electrically connected to the first and the second contact surfaces of the second input electrode, respectively, and a proximal end of the second reference signal wire is electrically connected to the reference contact surface of the second input electrode;
    each of the first, the second, the third and the fourth input signal wires and the first and the second reference signal wires has a distal end that is connected to a respective one of the plurality of input plugs on the top wall of the EMG amplifier unit such that input signals collected by the first and the second electrodes are transmitted to the signal amplifier, output signals of the signal amplifier are transmitted from the signal amplifier to the signal input of the signal processor which transmits processed output signals, via the signal output of the signal processor, to the at least one output signal plug of the enclosure, and the at least one output signal plug of the enclosure being electrically connected with a prosthesis control which controls a prosthesis based on the output signals of the signal processor.

2. The EMG amplifier unit according to claim 1, wherein the top wall of the enclosure has first and second channels that extend from the back wall to adjacent the front wall of the enclosure, the first and the second channels separating the plurality of input plugs into two input signal contact groups, wherein first, second and third input plugs of the plurality of input plugs are located within the first channel and fourth, fifth and sixth input plugs of the plurality of input plugs are located within the second channel.

3. The EMG amplifier unit according to claim 1, wherein the distal ends of each of the first, the second, the third and the fourth input signal wires and the first and the second reference signal wires has a plug that is connnected to a respective one of the plurality of input plugs.

* * * * *